United States Patent
Okita

(10) Patent No.: US 10,466,522 B2
(45) Date of Patent: Nov. 5, 2019

(54) DISPLAY DEVICE

(71) Applicant: Japan Display Inc., Tokyo (JP)

(72) Inventor: Mitsutaka Okita, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/935,116

(22) Filed: Mar. 26, 2018

(65) Prior Publication Data

US 2018/0210257 A1    Jul. 26, 2018

Related U.S. Application Data

(63) Continuation of application No. 14/688,420, filed on Apr. 16, 2015, now Pat. No. 9,958,720.

(30) Foreign Application Priority Data

Apr. 17, 2014  (JP) .................................. 2014-085473
Apr. 17, 2014  (JP) .................................. 2014-085475

(51) Int. Cl.
*G02F 1/1333*  (2006.01)
*H01L 27/12*  (2006.01)
(Continued)

(52) U.S. Cl.
CPC .... *G02F 1/13338* (2013.01); *G02F 1/134363* (2013.01); *G02F 1/136286* (2013.01); *H01L 27/124* (2013.01); *G02F 1/133512* (2013.01)

(58) Field of Classification Search
CPC .......... G02F 1/13338; G02F 1/134363; G02F 1/136286; H01L 27/124
See application file for complete search history.

(56) References Cited

U.S. PATENT DOCUMENTS

| 8,217,913 B2 * | 7/2012 | Hotelling | ............. G06F 3/0412 |
| | | | 345/173 |
| 8,786,557 B2 * | 7/2014 | Noguchi | ............. G02F 1/13338 |
| | | | 345/173 |

(Continued)

FOREIGN PATENT DOCUMENTS

| EP | 2720124 A2 | 4/2014 |
| JP | 2008-32899 A | 2/2008 |

(Continued)

OTHER PUBLICATIONS

Japanese Office Action dated Dec. 5, 2017 for the corresponding Japanese Patent Application No. 2014-085473.

(Continued)

*Primary Examiner* — James A Dudek
(74) *Attorney, Agent, or Firm* — Michael Best & Friedrich LLP

(57) ABSTRACT

If a divided area of common electrode layers is positioned on a source line, a leakage electric field on the source line has an effect on a liquid crystal layer through the divided area of the common electrode layers. A display device includes an array substrate and a counter substrate. The array substrate includes scanning signal wiring layers, video signal wiring layers, pixel electrode layers arranged in a layer higher than the video signal wiring layers, and common electrode layers arranged in a layer higher than the pixel electrode layers. The common electrode layers are arranged in positions covering the video signal wiring layers in a plan view. The common electrode layers are divided in the extending direction of the video signal line.

14 Claims, 10 Drawing Sheets

(51) Int. Cl.
*G02F 1/1343* (2006.01)
*G02F 1/1362* (2006.01)
*G02F 1/1335* (2006.01)

(56) References Cited

U.S. PATENT DOCUMENTS

| | | | | |
|---|---|---|---|---|
| 8,937,690 B2* | 1/2015 | Nam | ............... | G02F 1/136286 349/12 |
| 9,367,165 B2* | 6/2016 | Araki | ............... | G06F 3/0412 |
| 2002/0008796 A1* | 1/2002 | Kung | ............... | G02F 1/13318 349/42 |
| 2002/0051101 A1* | 5/2002 | Kurahashi | ......... | G02F 1/134363 349/43 |
| 2002/0101557 A1* | 8/2002 | Ono | ............... | G02F 1/134363 349/143 |
| 2002/0149729 A1* | 10/2002 | Nishimura | ........ | G02F 1/134363 349/141 |
| 2003/0043329 A1* | 3/2003 | Park | ............... | G02F 1/134363 349/141 |
| 2003/0179331 A1* | 9/2003 | Kurahashi | ......... | G02F 1/134363 349/122 |
| 2005/0200790 A1* | 9/2005 | Konno | ............. | G02F 1/134363 349/139 |
| 2005/0200791 A1* | 9/2005 | Ahn | ............... | G02F 1/134363 349/141 |
| 2007/0024789 A1* | 2/2007 | Itou | ............... | G02F 1/134363 349/139 |
| 2007/0024791 A1* | 2/2007 | Nishida | ............. | G02F 1/134363 349/141 |
| 2007/0195029 A1* | 8/2007 | Jeon | ............... | G02F 1/13338 345/87 |
| 2007/0273819 A1* | 11/2007 | Kawasaki | ......... | G02F 1/134363 349/141 |
| 2008/0024416 A1 | 1/2008 | Onogi et al. | | |
| 2008/0062140 A1* | 3/2008 | Hotelling | ............ | G09G 3/3648 345/173 |
| 2008/0180407 A1* | 7/2008 | Utsunomiya | ......... | G06F 3/0412 345/174 |
| 2009/0185088 A1* | 7/2009 | Shinohara | ............ | G06F 3/0412 349/12 |
| 2009/0268132 A1* | 10/2009 | Takama | ............ | G02F 1/13338 349/106 |
| 2010/0194697 A1* | 8/2010 | Hotelling | ............ | G06F 3/0412 345/173 |
| 2010/0214262 A1 | 8/2010 | Ishizaki et al. | | |
| 2010/0231544 A1* | 9/2010 | Lu | ............... | G02F 1/134363 345/173 |
| 2012/0105337 A1 | 5/2012 | Jun et al. | | |
| 2012/0133858 A1 | 5/2012 | Shin et al. | | |
| 2012/0268396 A1* | 10/2012 | Kim | ............... | G06F 3/0412 345/173 |
| 2012/0327353 A1* | 12/2012 | Doi | ............... | G02F 1/13338 349/143 |
| 2013/0077008 A1 | 3/2013 | Kim et al. | | |
| 2013/0250225 A1* | 9/2013 | Maeda | ............. | G02F 1/13338 349/143 |
| 2013/0293491 A1* | 11/2013 | Doi | ............... | G06F 3/044 345/173 |
| 2014/0036166 A1* | 2/2014 | Kurasawa | ......... | G02F 1/13338 349/12 |
| 2014/0071387 A1 | 3/2014 | Sakai et al. | | |
| 2014/0104510 A1* | 4/2014 | Wang | ............... | G06F 3/0412 349/12 |
| 2014/0118639 A1* | 5/2014 | Matsushima | ....... | G02F 1/13338 349/12 |
| 2014/0152613 A1* | 6/2014 | Ishizaki | ............. | G06F 3/0412 345/174 |
| 2014/0152616 A1* | 6/2014 | Kida | ............... | G06F 3/0418 345/174 |
| 2014/0160066 A1 | 6/2014 | Kim et al. | | |
| 2014/0184944 A1* | 7/2014 | Ma | ............... | G02F 1/134363 349/12 |
| 2014/0293156 A1* | 10/2014 | Kim | ............... | G06F 3/0412 349/12 |
| 2015/0054803 A1* | 2/2015 | Yashiro | ............. | G06F 3/041 345/206 |
| 2015/0097192 A1* | 4/2015 | Araki | ............... | G06F 3/0412 257/72 |
| 2015/0192814 A1 | 7/2015 | Kosugi et al. | | |
| 2015/0301381 A1* | 10/2015 | Okita | ............... | G02F 1/13338 349/12 |

FOREIGN PATENT DOCUMENTS

| | | |
|---|---|---|
| JP | 2010-197576 A | 9/2010 |
| JP | 2012-098687 A | 5/2012 |
| JP | 2013-68949 A | 4/2013 |
| KR | 101318448 B1 | 10/2013 |
| WO | 2012073792 A1 | 6/2012 |
| WO | 2012/165221 A1 | 12/2012 |
| WO | 2014/045601 A1 | 3/2014 |

OTHER PUBLICATIONS

Japanese Office Action dated Dec. 5, 2017 for the corresponding Japanese Patent Application No. 2014-085475.

* cited by examiner

DISPLAY DEVICE

CROSS-REFERENCE TO RELATED APPLICATIONS

This application is a continuation of U.S. patent application Ser. No. 14/688,420 filed on Apr. 16, 2015. Further this application claims priority from Japanese patent application JP2014-085473 filed on Apr. 17, 2014, and Japanese patent application JP2014-085475 filed on Apr. 17, 2014, the contents of which are hereby incorporated by reference into this application.

BACKGROUND

The present invention relates to a display device, and is applicable to a display device having, for example, an in-cell touch panel.

In recent years, in liquid crystal display devices for use in mobile devices, an electrostatic capacitive touch panel has been introduced as an input function mainly for smartphones. In this electrostatic capacitive touch panel, an "in-cell" pattern of embedding its function into the liquid crystal display device has been advanced.

As disclosed in International Unexamined Patent Application No. 2012/073792 (Patent Literature 1), the common electrode is divided into a plurality of areas, to serve also as a driving electrode and a detection electrode for the in-cell touch panel. The divided areas of the common electrode extend in a row direction (a scanning line extending direction) and/or a column direction (a signal line extending direction) on the color pixel boundaries. Further, the common electrode has slits (long holes) which extend in a row direction and/or a column direction on the color pixel boundaries.

SUMMARY

Like in International Unexamined Patent Application No. 2012/073792, if the divided area of the common electrode is positioned on a signal line, a leakage electric field from the signal line has an effect on the liquid crystal layer through the divided area of the common electrode. Thus, in any pixel adjacent to the divided area of the common electrode, desired display is not achieved by the effect of the electric field from the signal line. In particular, when assembly deviation occurs between the counter substrate and the array substrate, the divided area of the common electrode appears to be as a line.

Other objects and new features will become apparent from the following detailed descriptions of the present disclosure and the attached drawings.

Of the present disclosure, the representative descriptions will briefly be made as follows.

(1) A display device includes a first substrate and a second substrate. The array substrate includes first signal wiring layers extending in a first direction, second signal wiring layers extending in a second direction different from the first direction, pixel electrode layers arranged in a layer higher than the second signal wiring layers, common electrode layers arranged in a layer higher than the pixel electrode layers, and wring layers arranged on and in contact with the common electrode layers. The common electrode layers are arranged in positions covering the second signal wiring layers in a plan view. The wiring layers are arranged in positions covering the second signal wiring layer in a plan view. The common electrode layers are divided in the second direction.

(2) A display device includes a first substrate and a second substrate. The first substrate includes first signal wiring layers extending in a first direction, second signal wiring layers extending in a second direction different from the first direction, first signal wiring layers extending in the second direction, a first insulating layer, a second insulating layer, common electrode layers arranged in a layer lower than the first insulating layers through the first insulating layer, and pixel electrode layers arranged in a layer higher than the first wiring layers through the second insulating layer. The first wiring layers are arranged in position covering the second signal wiring layers in a plan view. The common wiring layers are divided on the second signal wiring layers in the second direction.

DESCRIPTION OF THE PREFERRED EMBODIMENTS

Figure 1:
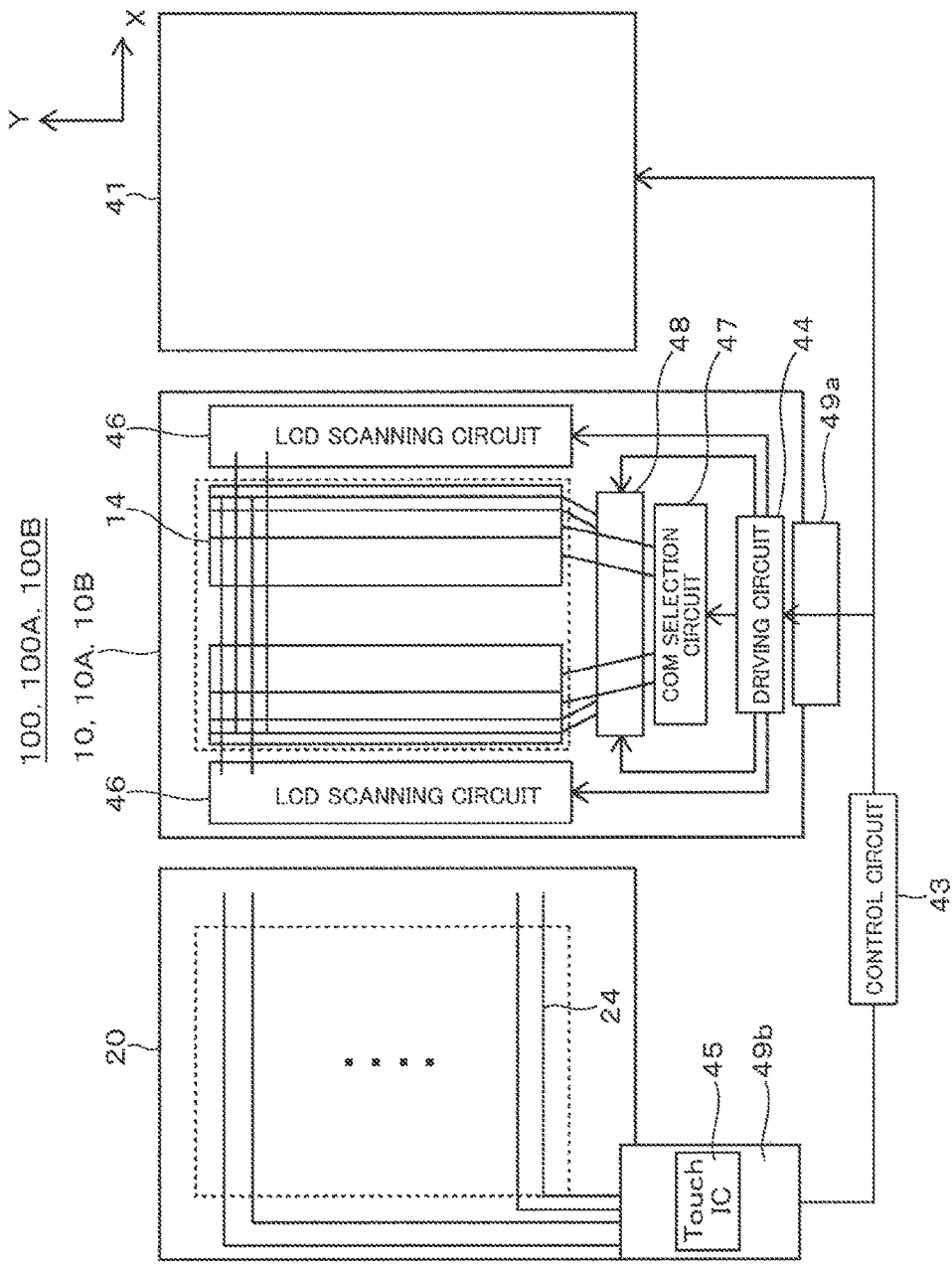
FIG. 1 is a plan view illustrating a configuration of a display device according to an embodiment and a comparative example.

Preferred embodiments and a comparative example will now be described with reference to the accompanying drawings. The disclosure has been made by way of example only. Modifications or changes that can be easily made by those skilled in the art are inevitably included in the present invention, as long as they do not deviate from the spirit of the present invention. For the sake of clear explanations, in the illustrations, the width, thickness, and form of each part may schematically be expressed, as compared with their actual mode. However, they are for example only, and not to limit the interpretation of the present invention. In the present specifications and illustrations, the similar constituent elements as those described in previously described illustrations are identified with the same reference numerals, and may not repeatedly be described.

Descriptions will now be made to the contents that are common among the techniques examined prior to the present disclosure (hereinafter referred to as a comparative example), First Embodiment, and Second Embodiment, using FIG. 1 and FIG. 2.

Figure 2:
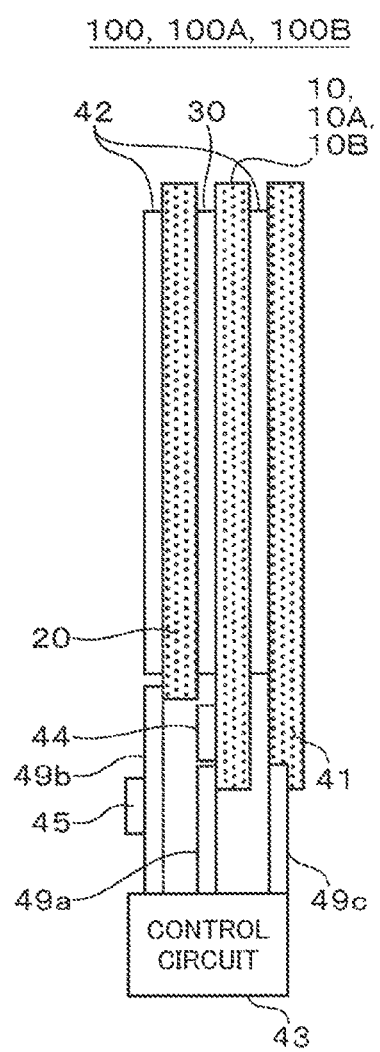
FIG. 2 is a side view illustrating a configuration of the display device according to the embodiment and the comparative example.

FIG. 1 is a plan view illustrating a configuration of a display device according to an embodiment and a comparative example. FIG. 2 is a side view illustrating a configuration of the display device according to the embodiment and the comparative example. Liquid crystal display devices 100, 100A, and 100B according to the comparative example, the First Embodiment, and the Second Embodiment have an in-cell touch panel function. Their common electrode layer serves also as a function as a driving electrode layer for the touch panel.

The display devices 100, 100A and 100B have array substrates 10, 10A, and 10B, a counter substrate 20, a liquid crystal layer 30, a backlight 41, a polarizing plate 42, a control circuit 43, a touch IC 45, and cables 49a, 49b, and 49c. The display devices 100, 100A, and 100B are elongated in the vertical direction (the length in the Y direction is longer than that in the X direction). In each of the array substrates 10, 10A, and 10B, an LCD scanning circuit 46, a common electrode selection circuit (COM selection circuit) 47, and a signal line selection circuit 48 are formed using a TFT. In each of the array substrates 10, 10A, and 10B, a driving circuit (formed with a semiconductor integrated circuit (IC), such as a CMOS) 44 is mounted with a COG (Chip on Glass) method. The driving circuit 44 is connected to the control circuit 43 formed with an IC, through the cable 49a. A plurality of detection electrode wiring layers 24 extending in the X direction are formed on the upper surface (the opposed side of the liquid crystal layer 30) of the counter substrate 20, and are connected to the touch IC 45 mounted on the cable 49b, through the cable 49b. The cable 49b is connected to the control circuit 43. The backlight 41 is connected to the control circuit 43 through the cable 49c. The polarizing plate 42 is arranged between the backlight 41 and the array substrate 10, 10A, or 10B, and on the upper surface of the counter substrate 20.

Common electrode layers 14, having a function also as the driving electrode wiring layer for the touch panel, extend in the Y direction, and are divided in the X direction and periodically arranged. The detection electrode wiring layers 24 extend in the X direction, and the plurality of the layers 24 are arranged in the Y direction. Because the common electrode layers (the driving electrode wiring layer for the touch panel) extend in the Y direction, the driving electrode wiring layer for the touch panel does not intersect the source wiring layer. Thus, it is possible to prevent an increase in the load on the driving electrode for the touch panel by the effect of the capacity between the driving electrode wiring layer for the touch panel and the source wiring layer.

The liquid crystal display devices 100, 100A, and 100B according to the comparative example, the First Embodiment, and the Second Embodiment have substantially the same configuration, except the array substrates 10, 10A, and 10B.

The comparative example will now be described using FIG. 3 and FIG. 4.

Figure 3:
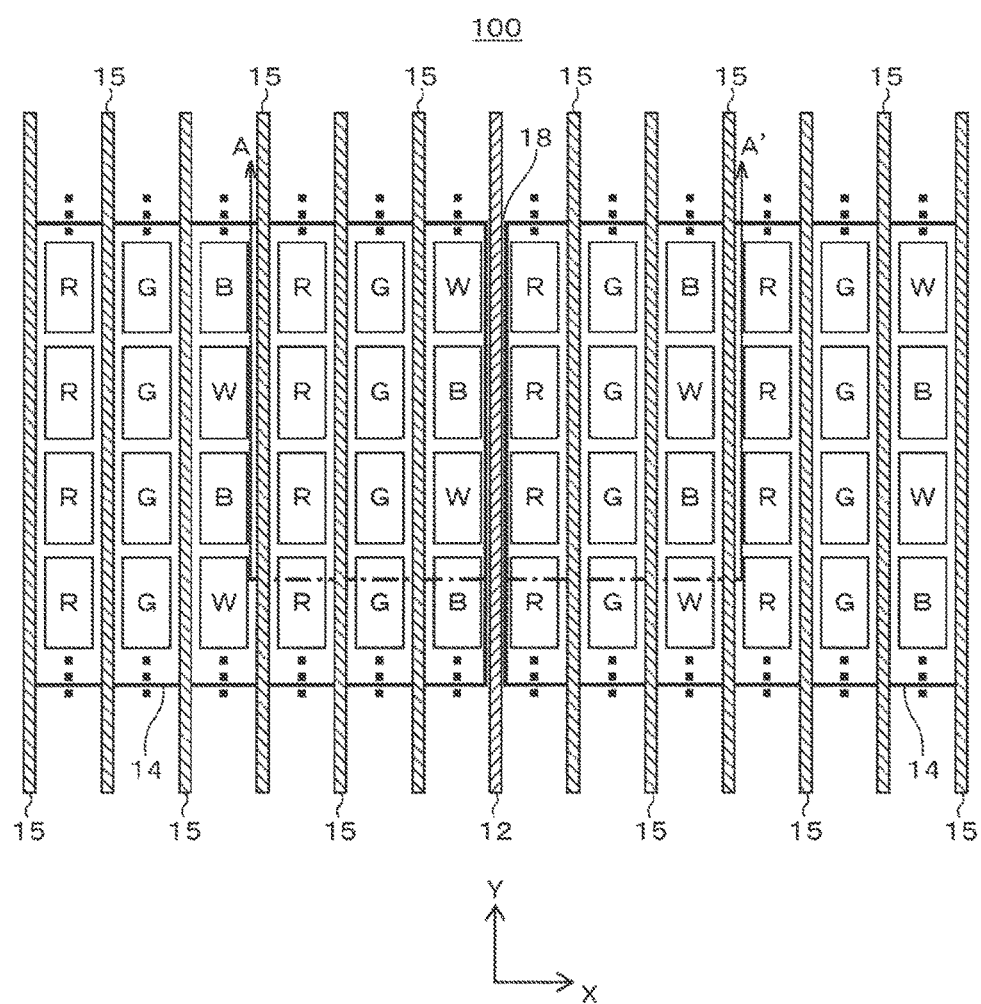
FIG. 3 is a plan view for explaining a configuration of the display device according to the comparative example.
Figure 4:
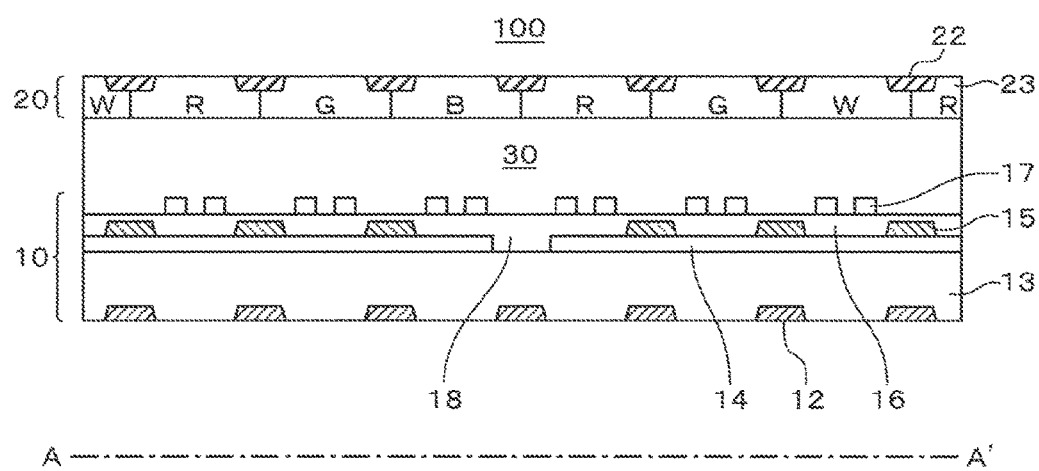
FIG. 4 is a cross sectional view taken along a line A-A' of FIG. 1.

FIG. 3 is a plan view for explaining the configuration of the display device according to the comparative example. FIG. 4 is a cross sectional view taken along a line A-A' of FIG. 3.

The display device 100 according to the comparative example includes sub pixels with a vertical stripe form of red (R), green (G), blue (B), and white (W). One pixel is formed with RGB and RGW, respectively, and RGB pixels and RGW pixels are alternately arranged. B and W include the number of pixels that is half the number of pixels of R or G. The display device 100 includes the array substrate 10, the counter substrate 20, and the liquid crystal layer 30, which is arranged between the array substrate 10 and the counter substrate 20.

On the array substrate 10, the common electrode layers 14 are arranged on a signal wiring layer 12 through a flattening film 13. Pixel electrode layers 17 are provided on the common electrode layers 14 through an insulating layer 16. The common electrode layers 14 extend in a direction (Y direction) parallel to the signal wiring layer 12, and are divided in the X direction and periodically arranged. Wiring auxiliary layers 15 are arranged in the form that they are connected to the common electrode layers 14, on the signal wiring layers 12. In other words, the wiring auxiliary layers 15 are arranged between sub pixels of different colors. To prevent that the divided common electrode layers 14 are short out each other, the wiring auxiliary layers 15 are not arranged in a divided position (divided area) 18 of each of the common electrode layers 14. The common electrode layers 14 and the pixel electrode layers 17 are formed with a light transmissive conductive film, such as an ITO (Indium Tin Oxide), while the wiring auxiliary layers 15 and the signal wiring layer 12 are formed with a light shielding conductive film (a low resistive conductive film or a metal film). The wiring auxiliary layers 15 are provided to reduce the resistance of the common electrode layers 14.

The counter substrate 20 includes a black matrix (a light shielding layer) 22 and color filters (coloring layers) of R, G, B, and W. The color filters 23 are repeatedly arranged in a row direction (X direction) sequentially in the order of R, G, B, R, G, and W. The same colors of the color filters 23 of R and G are arranged in a column direction (Y direction), while the filters of B and W are alternately arranged. The color filters 23 form a stripe pattern (a rectangular form), in which the length in the X direction is shorter than the length in the Y direction, in a plan view.

As described above, in the display device 100, the divided area is positioned above the signal wiring layer 12. Thus, a leakage electric field from the signal wiring layer 12 through the divided area 18 has an effect on the liquid crystal layer 30. This may result in that desired display is not achieved by the effect of the electric field from the signal wiring layer 12, with the sub pixels adjacent to the divided area 18. When the assembly deviation occurs, particularly, between the counter substrate 20 and the array substrate 10, the divided area 18 appears to be as a line.

In the display device according to the embodiment, a shield layer is provided on the signal wiring layer 12 to prevent that the leakage electric field from the signal wiring layer 12 effects the liquid crystal layer 30. As a shield layer, it is preferred to use a wiring layer with a fixed potential.

In the embodiment as will be described later, descriptions will be made to an FFS (Fringe Field Switching) mode liquid crystal display panel. However, it is not limited to this panel, and is applicable also to a horizontal field liquid crystal display panel, such as an IPS (In-Plane-Switching) mode panel.

First Embodiment

Figure 6:
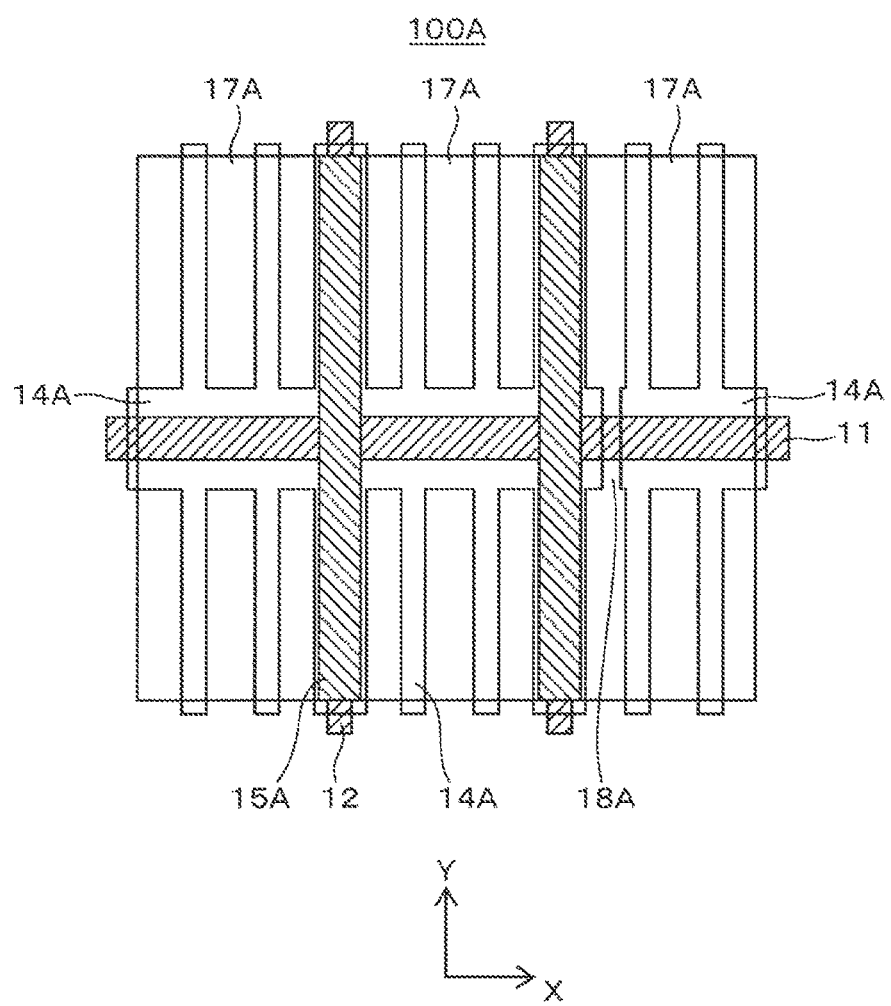
FIG. 6 is an enlarged view of a part shown with a dashed line C of FIG. 5.
Figure 7:
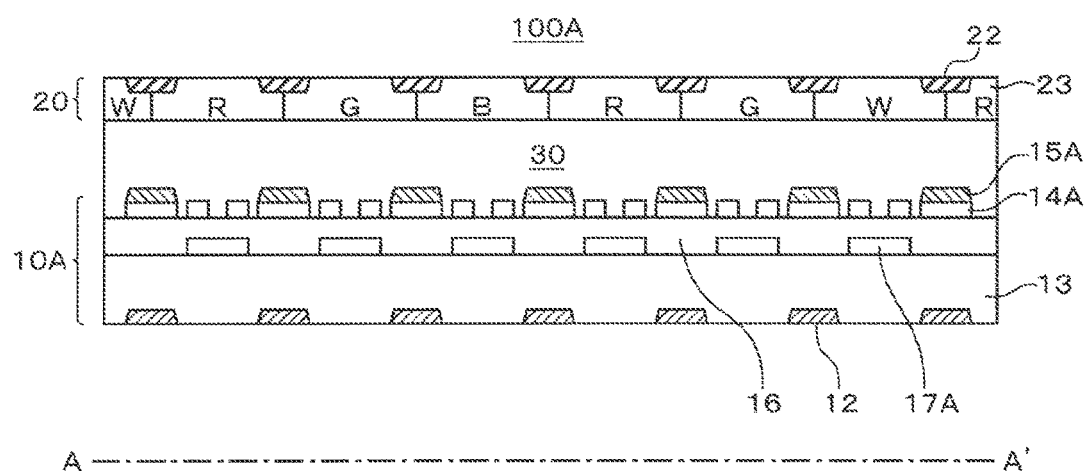
FIG. 7 is a cross sectional view taken along the line A-A' of FIG. 5.

Descriptions will now be made to a first embodiment (First Embodiment) in which a shield layer is provided on the signal wiring layer, using FIG. 5 to FIG. 7.

Figure 5:
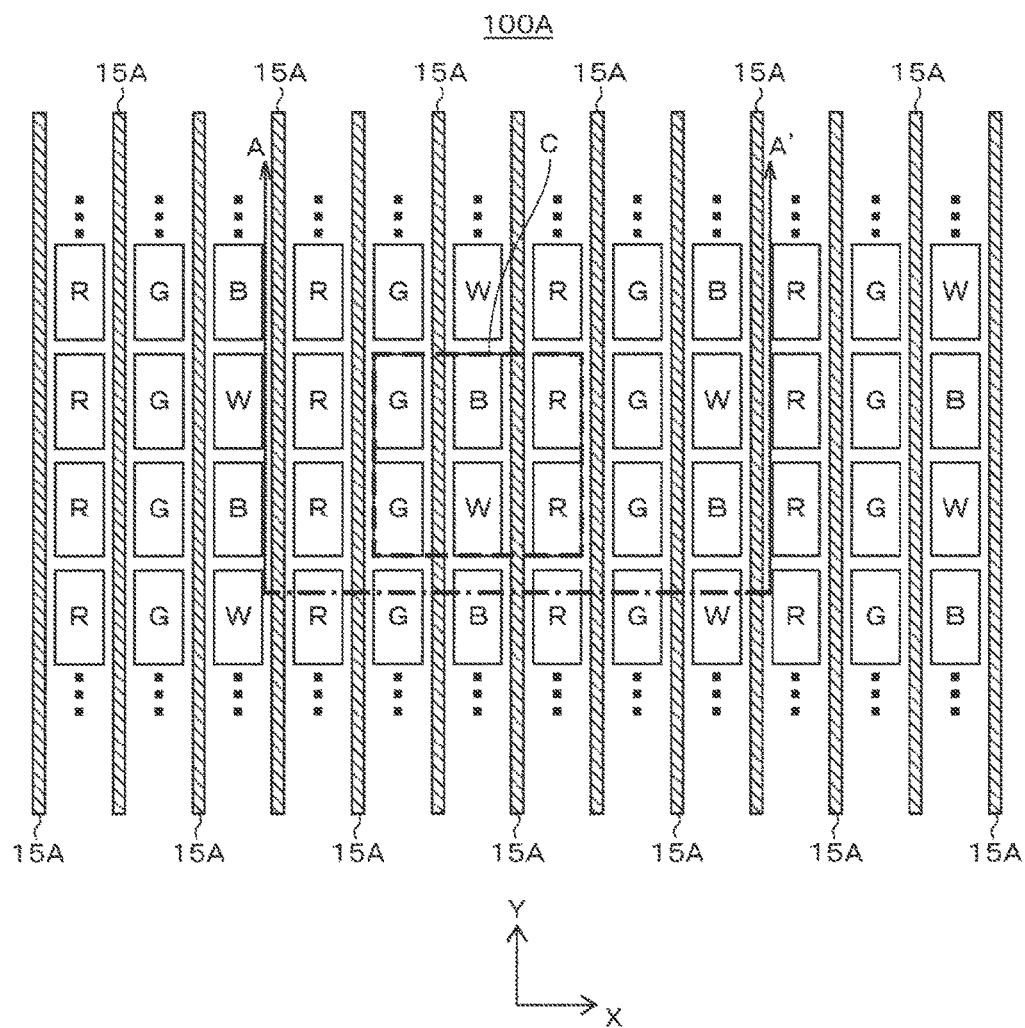
FIG. 5 is a cross sectional view for explaining a configuration of a display device according to First Embodiment.

FIG. 5 is a plan view for explaining a configuration of a display device according to the First Embodiment. FIG. 6 is an enlarged view of a part shown with a dashed line C of FIG. 5. FIG. 7 is a cross sectional view taken along a line A-A' of FIG. 5.

A display device 100A according to the First Embodiment has the same pixel configuration and alignment as those of the display device 100 according to the comparative example. That is, the counter substrate 20 has the same structure. The display device 100A includes the array substrate 10A, the counter substrate 20, and the liquid crystal 30 arranged between the array substrate 10A and the counter substrate 20. It may include sub pixels of R, G, and B with a vertical stripe form, in which R, B, and B form one pixel. That is, the color filters 23 may repeatedly be arranged in the row direction (X direction) sequentially in the order of R, G, and B, and the same colors may be arranged in the column direction (Y direction) of the color filters 23.

On array substrate 10A, pixel electrode layers 17A are arranged on the signal wiring layer (a video signal wiring layer or a second signal wiring layer (s)) 12 through the flattening film 13. The common electrode layers 14A are arranged on the pixel electrode layers 17A through the insulating layer 16. The common electrode layers 14A extend in a direction (Y direction) parallel to the signal wiring layer 12, and is divided in the X direction and periodically arranged. Scanning wiring layers (a scanning signal wiring layer (s) or a first signal wiring layer (s)) 11 extends in the X direction. A divided area 18A of the common electrode layers 14A is arranged in a position, in which the signal wiring layer 12 is not arranged and which intersects the scanning wiring layer 11. Slits are formed in the common electrode layers 14A of the opening of the sub pixels. The signal wiring layer 12 is covered with the common electrode layers 14A. Wiring auxiliary layers (first wiring layers) 15A are arranged on the signal wiring layer 12, by being in contact with the common electrode layers 14A. In other words, the wiring auxiliary layers 15A are arranged between the sub pixels of different colors. The wiring auxiliary layers 15A are arranged to be covered with the light shielding layer 22. The common electrodes 14A exist on the scanning wiring layer 11. The divided area 18A is arranged in a position, in which the wiring auxiliary layers 15A are not arranged and which intersects the scanning wiring layer 11. The divided area 18A is arranged to be covered with the light shielding layer 22. The common electrode layer 14A and the pixel electrode layers 17A are formed with light transmissive conductive films, such as an ITO (Indium Tin Oxide), while the wiring auxiliary layers 15A and the signal wiring layer 12 are formed with a metal film (a light shielding conductive film).

As described above, in the display device 100A, the common electrode layers 14A are arranged on the signal wiring layer 12, thus enabling to shield the leakage electric field from the signal wiring layer 12 using the common electrode layers 14A. As a result, it is possible to prevent that the divided area 18 appears to be as a line, like in the display device according to the comparative example.

To shield the leakage electric field from the signal wiring layer 12, the wiring auxiliary layers 15A are not necessarily provided. When the wiring auxiliary layers 15A are formed with light shielding films, in a high definition panel, it is possible to reduce color mixture, in the viewing field, due to the assembly deviation of the counter substrate 20 and the array substrate 10. When the wiring auxiliary layers 15A are formed with low resistive films, it is possible to reduce the resistance of the common electrode layers 14A.

The above-described First Embodiment will briefly be described as follows.

(1) The display device includes the array substrate, the counter substrate, and the liquid crystal layer arranged between the array substrate and the counter substrate. The array substrate includes the scanning signal wiring (s) extending in a first direction, the video signal wiring layer(s) extending in a second direction different from the first direction, the pixel electrode layers arranged in a layer higher than the video signal wiring layer, and the common electrode layers arranged in a layer higher than the pixel electrode layers. The common electrode layers are arranged in a position to cover the video signal wiring layers in a plan view, and the common electrode layers are divided in the second direction.

(2) In the above-described display device of (1), the divided part of the common electrode layers is in a position intersecting the scanning signal wiring layer(s) between those adjacent video signal wiring layers.

(3) In the above-described display device of (1), the wiring auxiliary layers are arranged on and in contact with the common electrode layers, and the wiring auxiliary layers are arranged in positions covering the video signal wiring layers in a plan view.

(4) In the display device of (3), the divided part of the common electrode layers is in a position in which the wiring auxiliary layers are not arranged.

(5) In the display device of (3), the wiring auxiliary layers are light shielding conductive films.

(6) In the display device of (1), the common electrode layers are arranged in positions covering the scanning signal wiring layer in a plan view.

(7) In the display device of (1), the counter substrate includes the light shielding layer and the color filters. The light shielding layer is arranged in a position covering the wiring auxiliary layers in a plan view.

(8) In the display device of (1), the light shielding layer is arranged in a position covering the divided part of the common electrode layers in a plan view.

(9) In the display device of (1), the pixel electrodes and the common electrode layers are a transparent conductive film.

(10) In the display device of (1), the counter substrate includes the detection electrode wiring layers extending in the first direction. The common electrode layers serve also as a function of the driving electrode wiring layer for the in-cell touch panel.

(11) The display device includes a first substrate and a second substrate. The array substrate includes the first signal wiring layers extending in a first direction, the second signal wiring layers extending in the second direction different from the first direction, the pixel electrode layers arranged in a layer higher than the second signal wiring layers, the common electrode layers arranged in a layer higher than the pixel electrode layers, and the first wiring layers arranged on and in contact with the common electrode layers. The common electrode layers are arranged in positions covering the second signal wiring layers in a plan view. The first wiring layers are arranged in positions covering the second signal wiring layer in a plan view. The common electrode layers are divided in the second direction.

(12) In the display device of (11), the divided part of the common electrode layers is in a position in which the first wiring layer is not arranged.

(13) In the display device of (11), the common electrode layers are arranged in positions covering the first signal wiring layers in a plan view.

(14) In the display device of (11), the second substrate includes a light shielding layer. The light shielding layer is arranged in a position covering the wiring layer in a plan view.

(15) In the display device of (11), the first wiring layers are arranged between the sub pixels of different colors in a plan view.

(16) In the display device of (11), the pixel electrodes and the common electrode layers are transparent conductive films. The first wiring layer is a light shielding conductive film.

(17) In the display device of (11), the second substrate includes the detection electrode wiring layers extending in the first direction. The common electrode layers serve also as a function of the driving electrode wiring layer for the in-cell touch panel.

(18) In the display device of (11), the first signal wiring layers are scanning signal wiring layers. The second signal wiring layers are video signal wiring layers.

(19) In the display device of (11), the liquid crystal layer is arranged between the first substrate and the second substrate.

Second Embodiment

Descriptions will now be made to a second embodiment (Second Embodiment), in which a shield layer is provided on the signal wiring layer, using FIG. 8 to FIG. 11.

Figure 8:
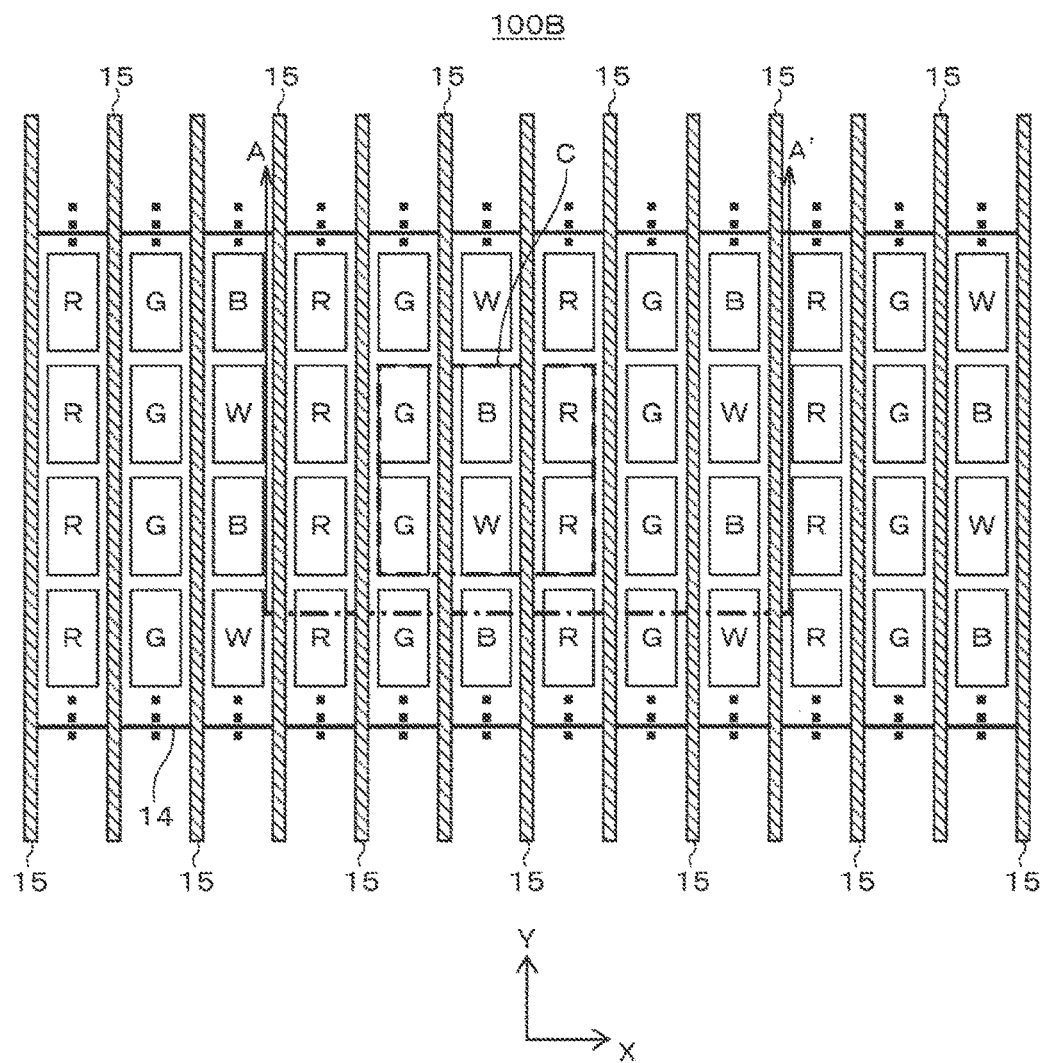
FIG. 8 is a plan view for explaining a configuration of a display device according to Second Embodiment.
Figure 9:
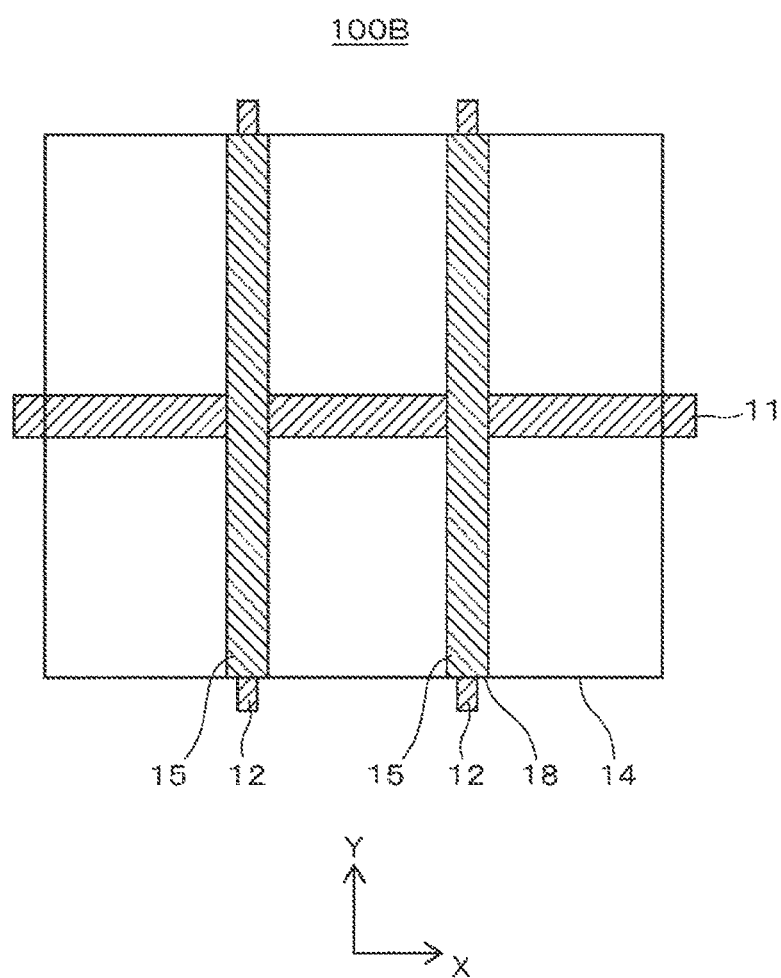
FIG. 9 is an enlarged view of a part shown with a dashed line C of FIG. 8.
Figure 10:
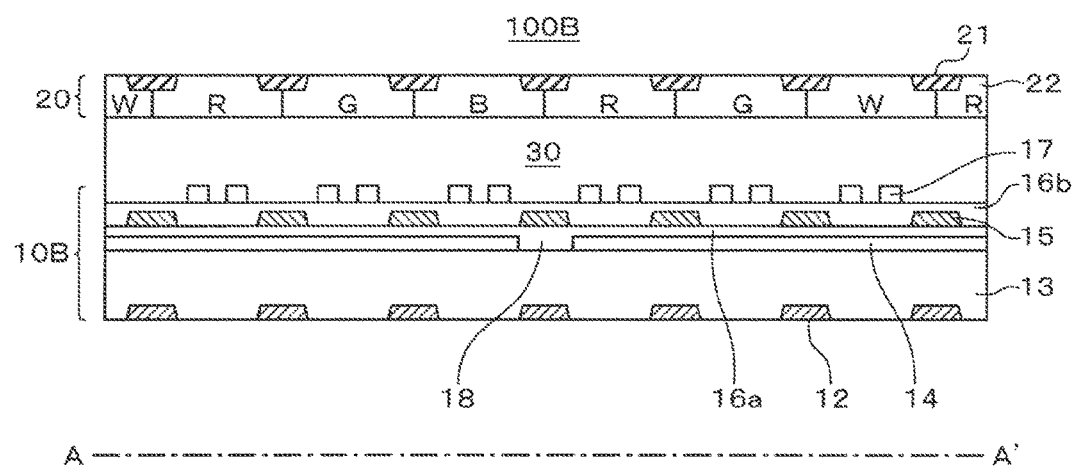
FIG. 10 is a cross sectional view taken along a line A-A' of FIG. 8.
Figure 11:
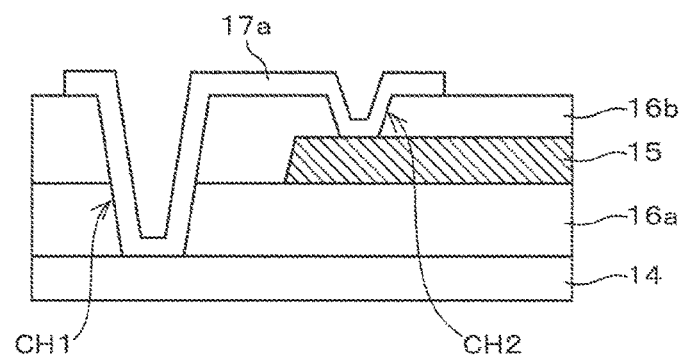
FIG. 11 is a cross sectional view of a peripheral part of an array substrate.

FIG. 8 is a plan view for explaining a configuration of the display device according to the Second Embodiment. FIG. 9 is an enlarged view of a part shown with a dashed line C of FIG. 8. FIG. 10 is a cross sectional view taken along a line A-A' of FIG. 8. FIG. 11 is a cross sectional view of a peripheral part of an array substrate.

A display device 100B according to the Second Embodiment has the same pixel configuration and alignment as those of the display device according to the comparative example. That is, a counter substrate 20 has the same structure. The display device 100B includes an array substrate (a first substrate) 10B, the counter substrate (a second substrate) 20, and a liquid crystal layer 30 arranged between the array substrate 10B and the counter substrate 20. It may include sub pixels with a vertical strip form of R, G, and B, in which R, G, and B form one pixel. That is, the color filters 23 may repeatedly be arranged in the row direction (X direction) sequentially in the order of R, G, and B, and the same colors of the color filters 23 may be arranged in the column direction (Y direction).

On the array substrate 10B, the common electrode layers 14 are arranged on the signal wiring layer (the video signal wiring layer or the second signal wiring layer) 12 through the flattening film 13. The wiring auxiliary layers (first wiring layers) 15 are arranged on the common electrode layers 14 through an insulating layer (a first insulating layer) 16a. The pixel electrode layers 17 are arranged on the wiring auxiliary layers 15 through an insulating layer (a second insulating layer) 16b. The common electrode layers 14 extend in a direction (Y direction) parallel to the signal wiring layer 12, and are divided in the X direction and periodically arranged. The scanning wiring layer (the scanning signal wiring layer or the first signal wiring layer) 11 extends in the X direction. The wiring auxiliary layers 15 extend in a direction (Y direction) parallel to the signal wiring layer 12, and are arranged between the sub pixels of different colors. In a high definition panel, the wiring auxiliary layers 15 serve also as a light shielding layer for preventing color mixture in the viewing angle, due to the assembly deviation of the counter substrate 20 and the array substrate 10B, and a role for reducing the resistance of the common electrode layers 14. The wiring auxiliary layers 15 are arranged also on the divided position (divided area) 18 of the common electrode layers 14. The common electrode layers 14 and the pixel electrode layers 17 are formed with light transmissive conductive layers, such as ITO, while the wiring auxiliary layers 15 and the signal wiring layer 12 are formed with light shielding conductive layers (low resistive conductive layers or metal layers).

As illustrated in FIG. 11, in the peripheral area outside the display area of the array substrate 10B, the common electrode layers 14 and the wiring auxiliary layers 15 are connected through the wiring layer (the second wiring layer) 17a. The wiring layer 17a is wiring in the same layer as the pixel electrode layers 17. The insulating layer 16a and the insulating layer 16b are simultaneously patterned to form a contact hole CH1. The insulating layer 16b is patterned to form a contact hole CH2. An ITO film is formed in the contact hole CH1 and the contact hole CH2 and on the upper surface of the insulating layer 16b, and is patterned, thereby forming the pixel electrode layers 17 and the wiring layer 17a.

As described above, in the display device 100B, the wiring auxiliary layers 15 are arranged on the divided area 18 of signal wiring 12, thereby enabling to shield the leakage electric field from the signal wiring layer 12 toward the pixel electrodes 17. As a result, it is possible to prevent that the divided area 18 appears to be as a line, like in the display device according to the comparative example.

Unlike the display device according to the comparative example, the wiring auxiliary layers 15 can be arranged on each signal wiring, thereby reducing color mixture in the viewing angle, due to the assembly deviation of the counter substrate 20 and the array substrate 10B.

A plurality of layers of the insulating films are provided between the common electrode layers 14 and the pixel electrode layers 17. The plurality of insulating films are simultaneously patterned. As a result, the number of times of film formation is increased, but the number of times of photolithography process is the same as that of the comparative example, thereby reducing the load on the manufacturing process.

The common electrode layers 14 and the wiring auxiliary layers 15 are connected, for example, on the peripheral part of the panel outside the display area. It is possible to enhance the shielding effect of the leakage electric field from the signal wiring layer to the pixel electrode layers without providing, in the pixels, the contact hole, which causes to reduce the numerical aperture. The wiring auxiliary layers 15 can be connected to the common electrode layers 14, thus reducing the resistance of the common electrode layers 14.

The above-described Second Embodiment will briefly be described as follows.

(1) The display device includes the array substrate, the counter substrate, and liquid crystal layer arranged between the array substrate and the counter substrate. The array substrate includes the scanning signal wiring layers extending in a first direction, the video signal wiring layers extending in a second direction which is different from the first direction, the wiring auxiliary layers extending in the second direction, the first insulating layer, the second insulating layer, the common electrode layers arranged in a layer lower than the wiring auxiliary layers through the first insulating layer, and the pixel electrode layers arranged in a layer higher than the wiring auxiliary layers through the second insulating layer. The wiring auxiliary layers are arranged in positions covering the video signal wiring layers in a plan view. The common electrode layers are divided in the second direction on the video signal wiring layers.

(2) In the display device of (1), the pixel electrode layers are isolated from the pixel electrode layer, and have the wiring layers in the same layer as the pixel electrode layer.

The common electrode layers are arranged in contact with the wiring auxiliary layers through the wiring layer.

(3) The display device of (1) has a first contact hole penetrating through the first insulating layer and the second insulating layer on the common electrode layers, and a second contact hole of the second insulating layer on the wiring auxiliary layers. The wiring layer is arranged to connect the common electrode layers inside the first contact hole and the wiring auxiliary layers inside the second contact hole.

(4) In the display device of (1), the counter substrate includes the color filters and the light shielding layer. The light shielding layer is arranged in a position covering the wiring auxiliary layers in a plan view.

(5) In the display device of (1), the wiring auxiliary layers are arranged between sub pixels of different colors in a plan view.

(6) In the display device of (1), the common electrode layers and the pixel electrode layers formed with transparent conductive films. The wiring auxiliary layers are formed with a light shielding conductive film.

(7) In the display device of (1), the counter substrate includes the detection electrode wiring layers extending in the first direction. The common electrode layers serve also as a driving electrode wiring layer for the in-cell touch panel.

(8) The display device includes the first substrate and the second substrate. The first substrate includes the first signal wiring layers extending in a first direction, the second signal wiring layers extending in a second direction different from the first direction, the first wiring layers extending in the second direction, the first insulating layer, the second insulating layer, the common electrode layers arranged in a layer lower than the first wiring layers through the first insulating layer, and the pixel electrode layers arranged in a layer higher than the first wiring layers through the second insulating layer. The first wiring layers are arranged in positions covering the second signal wiring layers in a plan view. The common electrode layers are divided in the second direction on the second signal wiring layers.

(9) The display device of (8) is isolated from the pixel electrode layers, and has the second wiring layers in the same layer as the pixel electrode layers. The common electrode layers are connected to the first wiring layers through the second wiring layers.

(10) The display device of (9) has a first contact hole penetrating through the first insulating layer on the common electrode layers and the second insulating layer, and a second contact hole of the second insulating layer on the first wiring layers. The second wiring layers are arranged to connect the common electrode layers inside the first contact hole and the wiring auxiliary layers inside the second contact hole.

(11) In the display device of (8), the second substrate includes the light shielding layer and the color layers. The light shielding layer is arranged in a position covering the first wiring layer in a plan view.

(12) In the display device of (8), the first wiring layers are arranged between the sub pixels of different colors in a plan view.

(13) In the display device of (8), the common electrode layers and the pixel electrode layers are transparent conductive films. The first wiring layers are light shielding conductive films.

(14) In the display device of (8), the second substrate includes the detection electrode wiring layers extending in the first direction. The common electrode layers serve also as the driving electrode wiring layer for the in-cell touch panel.

(15) In the display device of (8), the first signal wiring layers are wiring layers for a scanning signal. The second signal wiring layers are wiring layers for a video signal.

(16) The display device (8) includes the liquid crystal layer arranged between the first substrate and the second substrate.

What is claimed is:

1. A display device comprising:
    an array substrate,
    a counter substrate, and
    a liquid crystal layer arranged between the array substrate and the counter substrate,
    wherein the array substrate includes
    a scanning signal wiring extending in a first direction,
    a video signal wiring extending in a second direction which is different from the first direction,
    an auxiliary wiring extending in the second direction,
    a first insulating layer,
    a common electrode,
    a pixel electrode, and
    a contact wiring isolated from the pixel electrode and formed in the same layer as the pixel electrode,
    wherein the auxiliary wiring is arranged in positions covering the video signal wiring in a display region in a plan view,
    the first insulating layer is arranged between the auxiliary wiring and the common electrode,
    the common electrode is divided in the second direction right above the video signal wiring, and
    the common electrode is connected to the auxiliary wiring through the contact wiring.

2. The display device according to claim 1, further comprising:
    a second insulating layer arranged between the pixel electrode and the common electrode,
    a first contact hole formed through the first insulating layer and the second insulating layer on the common electrode, and
    a second contact hole formed through the second insulating layer on the auxiliary wiring,
    wherein contact wiring is arranged to connect the common electrode inside the first contact hole and the auxiliary wiring inside the second contact hole.

3. The display device according to claim 1,
    wherein the counter substrate includes the color filters and a light shielding layer, and
    the light shielding layer is arranged in a position covering the auxiliary wiring in a plan view.

4. The display device according to claim 1,
    wherein the auxiliary wiring is arranged between sub pixels of different colors in a plan view.

5. The display device according to claim 1,
    wherein the common electrode and the pixel electrode is formed with transparent conductive films, and
    the auxiliary wiring is formed with a light shielding conductive film.

6. The display device according to claim 1,
    wherein the counter substrate includes detection electrode wiring extending in the first direction, and
    the common electrode serve also as a driving electrode wiring for an in-cell touch panel.

7. A display device comprising:
    a first substrate,
    a second substrate, and a second wiring isolated from the pixel electrode and in the same layer as the pixel electrode, wherein the first substrate includes
- a first signal wiring extending in a first direction,
- a second signal wiring extending in a second direction different from the first direction,
- a first wiring extending in the second direction,
- a first insulating layer,
- a common electrode, and
- a pixel electrode, wherein the first wiring is arranged in positions covering the second signal wiring in a display region in a plan view, the first insulating layer is arranged between the first wiring and the common electrode, and the common electrode is divided in the second direction right above the second signal wiring, the common electrode is connected to the first wiring through the second wiring.

8. The display device according to claim 7, further comprising:
a second insulating layer arranged between the pixel electrode and the common electrode,
a first contact hole formed through the first insulating layer and second insulating layer on the common electrode; and
a second contact hole formed through the second insulating layer on the first wiring,
wherein the second wiring is arranged to connect the common electrode inside the first contact hole and the first wiring inside the second contact hole.

9. The display device according to claim 7,
wherein the second substrate includes a light shielding layer and color layers, and
the light shielding layer is arranged in a position covering the at least one of the first wiring in a plan view.

10. The display device according to claim 7,
wherein the first wiring layer is arranged between sub pixels of different colors in a plan view.

11. The display device according to claim 7,
wherein the common electrode and the pixel electrode are transparent conductive films, and
the first wiring is a light shielding conductive film.

12. The display device according to claim 7,
wherein the second substrate includes detection electrode wiring extending in the first direction, and
the common electrode serves also as the driving electrode wiring for an in-cell touch panel.

13. The display device according to claim 7,
wherein the first signal wiring layer is wiring for a scanning signal, and
the second signal wiring layer is wiring for a video signal.

14. The display device according to claim 7, further comprising: a liquid crystal layer arranged between the first substrate and the second substrate.

* * * * *